United States Patent
Kawabata

(10) Patent No.: US 10,242,954 B2
(45) Date of Patent: *Mar. 26, 2019

(54) ELECTRONIC CIRCUIT PACKAGE HAVING HIGH COMPOSITE SHIELDING EFFECT

(71) Applicant: TDK Corporation, Tokyo (JP)

(72) Inventor: Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 15/366,219

(22) Filed: Dec. 1, 2016

(65) Prior Publication Data

US 2018/0158782 A1    Jun. 7, 2018

(51) Int. Cl.
| | |
|---|---|
| *H01L 21/48* | (2006.01) |
| *H01L 21/56* | (2006.01) |
| *H01L 23/00* | (2006.01) |
| *H01L 23/29* | (2006.01) |
| *H01L 23/31* | (2006.01) |
| *H01L 23/498* | (2006.01) |
| *H01L 23/552* | (2006.01) |

(52) U.S. Cl.
CPC .......... *H01L 23/552* (2013.01); *H01L 21/485* (2013.01); *H01L 21/4853* (2013.01); *H01L 21/4857* (2013.01); *H01L 21/565* (2013.01); *H01L 23/295* (2013.01); *H01L 23/49822* (2013.01); *H01L 24/16* (2013.01); *H01L 23/3121* (2013.01); *H01L 23/3135* (2013.01); *H01L 2224/16157* (2013.01)

(58) Field of Classification Search
CPC ............. H01L 23/552; H01L 23/49822; H01L 23/3114; H01L 24/16; H01L 21/4853; H01L 21/565; H01L 21/485; H01L 21/78; H01L 21/4857; H01L 2224/16155; H01L 2224/16157; H01L 23/295; H01L 23/48922; H01L 23/3121; H01L 23/3135
USPC ......................................................... 257/659
See application file for complete search history.

(56) References Cited

U.S. PATENT DOCUMENTS

| | | | |
|---|---|---|---|
| 5,561,265 A * | 10/1996 | Livshits | H01L 23/08 |
| | | | 174/386 |
| 6,310,285 B1 | 10/2001 | Sato et al. | |

(Continued)

FOREIGN PATENT DOCUMENTS

| | | |
|---|---|---|
| JP | S59-132196 A | 7/1984 |
| JP | H01-283900 A | 11/1989 |

(Continued)

*Primary Examiner* — Kenneth Parker
*Assistant Examiner* — Scott E Bauman
(74) *Attorney, Agent, or Firm* — Young Law Firm, P.C.

(57) ABSTRACT

Disclosed herein is an electronic circuit package includes: a substrate having a power supply pattern; an electronic component mounted on a surface of the substrate; a magnetic mold resin that covers the surface of the substrate so as to embed the electronic component therein, the magnetic mold resin comprising a composite magnetic material containing a thermosetting resin material and a magnetic filler; and a laminated film including at least a metal film and a magnetic film, the laminated film covering at least an top surface of the magnetic mold resin. The metal film is connected to the power supply pattern, and the magnetic film has a higher effective permeability than that of the magnetic mold resin.

18 Claims, 16 Drawing Sheets

(56) References Cited

U.S. PATENT DOCUMENTS

| | | | |
|---|---|---|---|
| 8,664,751 B2* | 3/2014 | Kim | H01L 23/552 |
| | | | 257/659 |
| 9,269,673 B1* | 2/2016 | Lin | H01L 24/97 |
| 9,974,215 B1* | 5/2018 | Jeong | H05K 9/0088 |
| 2003/0024723 A1* | 2/2003 | Igarashi | C08G 59/08 |
| | | | 174/521 |
| 2003/0190498 A1* | 10/2003 | Fujieda | H01L 23/552 |
| | | | 428/8 |
| 2009/0166819 A1* | 7/2009 | Chen | B82Y 30/00 |
| | | | 257/659 |
| 2011/0304015 A1 | 12/2011 | Kim et al. | |
| 2017/0278804 A1* | 9/2017 | Kawabata | H01L 21/561 |
| 2017/0311448 A1* | 10/2017 | Kawabata | H01F 1/0306 |

FOREIGN PATENT DOCUMENTS

| | | | | |
|---|---|---|---|---|
| JP | H02-078299 A | 3/1990 | | |
| JP | H10-064714 A | 3/1998 | | |
| JP | 2010-087058 A | 4/2010 | | |
| JP | 5988003 B1* | 9/2016 | | H01L 21/561 |

* cited by examiner

ELECTRONIC CIRCUIT PACKAGE HAVING HIGH COMPOSITE SHIELDING EFFECT

BACKGROUND OF THE INVENTION

Field of the Invention

The present invention relates to an electronic circuit package and, more particularly, to an electronic circuit package provided with a composite shielding function having both an electromagnetic shielding function and a magnetic shielding function.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

In order to realize the higher shielding characteristics, a composite shielding structure is proposed in recent years. The composite shielding structure has both an electromagnetic shielding function and a magnetic shielding function. In order to realize the composite shielding structure, it is necessary to form, in an electronic circuit package, an electromagnetic shielding by a conductive film (metal film) and a magnetic shielding by a magnetic film.

For example, Japanese Patent Application Laid-Open No. 1984-132196 discloses an electronic circuit package whose shielding characteristics are enhanced by molding an electronic circuit using a magnetic mold resin and covering the entire structure with a metal casing.

However, in the electronic circuit package described in Japanese Patent Application Laid-Open No. 1984-132196, the entire body of the electronic circuit package is covered with a metal casing, making it difficult to achieve height reduction. Further, a large number of holes are formed in the metal casing and the metal casing is not connected to a ground pattern of substrate and, hence, a sufficient shielding effect cannot be obtained. In addition, a two-layered structure of the magnetic mold resin and metal casing may not achieve sufficient shielding performance.

SUMMARY

The object of the present invention is therefore to provide an electronic circuit package capable of achieving higher composite shielding effect.

An electronic circuit package according to the present invention includes a substrate having a power supply pattern, an electronic component mounted on the surface of the substrate, a magnetic mold resin that covers the surface of the substrate so as to embed the electronic component therein and is formed of a composite magnetic material containing a thermosetting resin material and a magnetic filler, and a laminated film that is composed of at least a metal film and a magnetic film and covers at least the top surface of the magnetic mold resin, wherein the metal film is connected to the power supply pattern, and the magnetic film has a higher effective permeability than that of the magnetic mold resin.

According to the present invention, a triple-shield structure in which the top surface of the magnetic mold resin is covered with the laminated film composed of the metal film and magnetic film, so that higher composite shielding effect can be obtained. The effective permeability of the magnetic film is preferably double or more the effective permeability of the magnetic mold resin. With this configuration, it is possible to achieve much higher composite shielding effect. The magnetic film may be a film formed of a composite magnetic material in which magnetic fillers are dispersed in a thermosetting resin material, a thin film formed of a soft magnetic material or ferrite, or a foil or a bulk sheet.

In the present invention, the laminated film preferably further covers the side surface of the magnetic mold resin. With this configuration, composite shielding characteristics in the side direction can be enhanced.

In the present invention, the magnetic film may be positioned between the magnetic mold resin and the metal film. Alternatively, the metal film may be positioned between the magnetic mold resin and the magnetic film.

In the present invention, the laminated film further includes an adhesive layer formed between the metal film and the magnetic film. This enables the metal film and the magnetic film to be tightly adhered to each other as well as prevents contact between them. In this case, the resistance value of the adhesive layer is preferably $10^6 \Omega$ or higher. With this configuration, an eddy current caused due to entrance of electromagnetic wave noise into the metal film hardly flows into the magnetic film.

In the present invention, it is preferable that a volume resistivity of the magnetic mold resin is equal to or larger than $10^{10} \Omega$, and a resistance value at an interface between the top surface of the magnetic mold resin and the laminated film is equal to or larger than $10^6 \Omega$. With this configuration, a sufficient insulation performance required for the mold member can be ensured. In addition, the resistance value at an interface between the top surface of the magnetic mold resin and the laminated film is equal to or larger than $10^6 \Omega$, thereby substantially preventing an eddy current generated when electromagnetic wave noise enters the metal film from flowing in the magnetic mold resin. As a result, it is possible to prevent deterioration in magnetic characteristics of the magnetic mold resin due to inflow of the eddy current.

Preferably, in the present invention, the magnetic filler includes a soft magnetic metal. This can enhance permeability of the magnetic mold resin. As a main component of the soft magnetic metal, at least one magnetic material selected from a group consisting of Fe, Fe—Co, Fe—Ni, Fe—Al, and Fe—Si may be used. Preferably, a surface of the magnetic filler is preferably insulation-coated, and more preferably, a film thickness of the insulation coating is equal to or larger than 10 nm. This can sufficiently enhance the volume resistivity of the magnetic mold resin. A shape of the magnetic filler is preferably substantially spherical. This can increase a ratio of the magnetic filler in the magnetic mold resin.

In the present invention, the magnetic mold resin may further include a non-magnetic filler. Addition of the non-magnetic filler allows achievement of a high filling level of the filler in the magnetic mold resin, whereby heat expansion coefficient can be controlled. Further, the presence of the non-magnetic filler allows fluidity at the molding time, dielectric characteristics, and mechanical properties such as strength or elastic modulus to be controlled. This can further enhance withstand voltage performance, insulating performance, and incombustibility.

Preferably, in the present invention, the metal film is mainly composed of at least one metal selected from a group consisting of Au, Ag, Cu, and Al, and more preferably, the surface of the metal film is covered with an antioxidant film.

In the present invention, it is preferable that the power supply pattern is exposed to a side surface of the substrate and that the metal film contacts the exposed power supply pattern. With this configuration, it is possible to easily and reliably connect the metal film to the power supply pattern.

The electronic circuit package according to the present invention may further include a non-magnetic member provided between the electronic component and the magnetic mold resin. With this configuration, it is possible to suppress fluctuation of characteristics of the electronic component due to proximity between the electronic component and the magnetic mold resin.

As described above, according to the present invention, it is possible to provide an electronic circuit package capable of achieving higher composite shielding effect.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
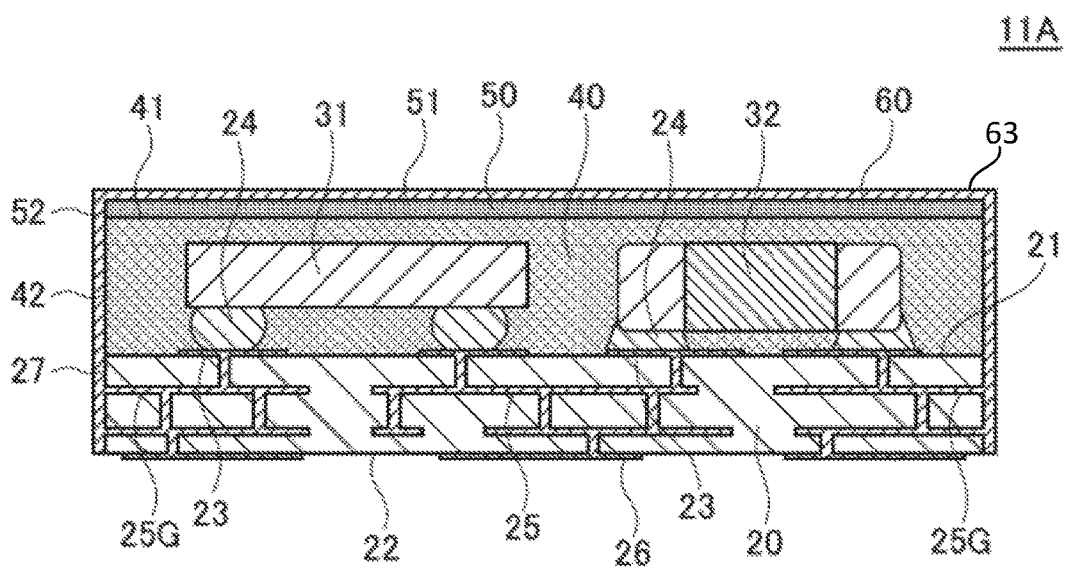
FIG. 1 is a cross-sectional view illustrating a configuration of an electronic circuit package according to a first embodiment of the present invention.

FIG. 1 is a cross-sectional view illustrating a configuration of an electronic circuit package 11A according to the first embodiment of the present invention.

As illustrated in FIG. 1, the electronic circuit package 11A according to the present embodiment includes a substrate 20, a plurality of electronic components 31 and 32 mounted on the substrate 20, a magnetic mold resin 40 covering a front surface 21 of the substrate 20 so as to embed the electronic components 31 and 32, a magnetic film 50 covering the magnetic mold resin 40, and a metal film 60 covering the magnetic film 50 and the magnetic mold resin 40.

Although the type of the electronic circuit package 11A according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester substrate, a phenol substrate, or an imide substrate; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and conductivity. The above conductive materials may be formed by using various methods such as printing, plating, foil lamination, sputtering, vapor deposition, and inkjet.

Out of the internal wirings 25 illustrated in FIG. 1, internal wirings 25G are power supply patterns. The power supply patterns 25G are typically ground patterns to which a ground potential is to be applied; however, it is not limited to the ground patterns as long as the power supply patterns 25G are a pattern to which a fixed potential is to be applied.

The magnetic mold resin 40 covers the front surface 21 of the substrate 20 so as to embed the electronic components 31 and 32 therein. The magnetic mold resin 40 is a mold member and serves also as a first magnetic shielding. In the present embodiment, a side surface 42 of the magnetic mold resin 40 and a side surface 27 of the substrate 20 form the same plane. The magnetic mold resin 40 is formed of a composite magnetic material in which magnetic fillers are dispersed in a thermosetting resin material. The magnetic mold resin 40 contacts the electronic components 31, 32 and land patterns 23, so that the volume resistivity thereof needs to be sufficiently large. Specifically, it is preferable that the volume resistivity is equal to or larger than $10^{10}$ Ωcm.

As the thermosetting resin material used for the composite magnetic material, an epoxy resin, a phenol resin, a silicone resin, a diallyl phthalate resin, a polyimide resin, an urethane resin, and the like may be used, and preferably, a base resin and a curing agent to be used for an epoxy resin- or a phenol resin-based semiconductor sealing material is used. The thermosetting resin material may be either liquid or solid, and the material form differs depending on selection of the base resin and curing agent according to a molding method. When a solid material is used, a material formed into a tablet can be used for transfer molding, and a material formed into a granular form can be used for injection molding or compression molding. A molding method for the thermosetting resin material may be appropriately be selected from among transfer molding, compression molding, injection molding, cast molding, vacuum cast molding, dispense molding, and molding using a slit nozzle. Molding conditions may be appropriately selected from among various combinations of the base resin, curing agent, and curing accelerator to be used. Post-curing may be applied after molding, as required.

The magnetic filler used for the composite magnetic material is preferably a soft magnetic metal having a high bulk permeability. As the soft magnetic metal, at least one magnetic material selected from a group consisting of Fe, Fe—Co, Fe—Ni, Fe—Al, and Fe—Si may be used. Specific examples include a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, Fe—Ni—Co alloy, and Fe. The shape of the magnetic filler is not especially limited; however, it may be formed into a spherical shape for a high filling level, and fillers of a plurality of particle sizes may be blended for a densest filling structure. Further, when the magnetic filler is formed into substantially a spherical shape, it is possible to reduce damage to be applied to the electronic components 31 and 32 upon molding.

A surface of the magnetic filler is preferably insulation-coated with a metal oxide such as Si, Al, Ti, Mg or an organic material for enhancing fluidity, adhesion, and insulation performance. In order to sufficiently increase the volume resistivity of the magnetic mold resin 40, a film thickness of the insulation coating is preferably set to equal to or larger than 10 nm. The insulation coating may be formed by coating a thermosetting material on the surface of the magnetic filler. Alternatively, an oxide film may be formed as the insulation coating by dehydration reaction of a metal alkoxide of tetraethyloxysilane or tetramethyloxysilane, and in this case, formation of a silicon oxide coating film is most preferable. More preferably, organic functional coupling treatment is applied to the formed coating film.

The composite magnetic material forming the magnetic mold resin 40 may be blended with a non-magnetic filler. When molten silica, calcium carbonate, magnesium oxide, aluminum oxide, titanium oxide, or the like is used as the non-magnetic filler, the insulating performance and withstand voltage performance of the magnetic mold resin 40 can be enhanced, and, further, incombustibility can be imparted to the magnetic mold resin 40. In addition, fluidity, dielectric constant, mechanical properties such as strength or elastic modulus can be controlled. Further, achievement of the high filling level by addition of the non-magnetic filler can reduce a heat expansion coefficient. In this case, a filler having a low heat expansion coefficient, such as molten silica or zirconium phosphate is preferably used. In order to enhance slidability and fluidity between fillers, surface-treated nanosilica having a particle size of equal to or smaller than 200 nm is preferably used. Further, coupling treatment may be applied to a surface of the non-magnetic filler for enhancement of adhesion and fluidity.

An upper surface 41 of the magnetic mold resin 40 is covered with the magnetic film 50. The magnetic film 50 is a film formed of a composite magnetic material in which magnetic fillers are dispersed in a thermosetting resin material, a thin film formed of a soft magnetic material or ferrite, or a foil or a bulk sheet and functions as a second magnetic shield. The effective permeability of the magnetic film 50 needs to be higher than at least the effective permeability of the magnetic mold resin 40 and, preferably, double or more the effective permeability of the magnetic mold resin 40.

When the film formed of a composite magnetic material is selected as the magnetic film 50, an epoxy resin, a phenol resin, a silicone resin, a diallyl phthalate resin, a polyimide resin, an urethane resin, and the like may be used as the thermosetting resin material, and the magnetic film 50 can be formed by using a thick-film formation method such as a printing method, a molding method, a slit nozzle coating method, a spray method, a dispensing method, an injection method, a transfer method, a compression molding method, or a lamination method using an uncured sheet-like resin. Using the thermosetting resin material can increase reliability (heat resistance, insulation performance, impact resistance, falling resistance) required for electronic circuit packages.

As the magnetic filler, a ferrite or a soft magnetic metal is preferably used, and a soft magnetic metal having a high bulk permeability is more preferably used. As the ferrite or soft magnetic metal, one or two or more metals selected from a group consisting of Fe, Ni, Zn, Mn, Co, Cr, Mg, Al, and Si and oxides thereof may be used. Specific examples include a ferrite (Ni—Zn ferrite, Mn—Zn ferrite, Ni—Cu—Zn ferrite, etc.), a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, Fe—Ni—Co alloy, and Fe. The shape of the magnetic filler is not especially limited; however, it may be formed into a spherical shape for a high filling level, and fillers of a plurality of particle sizes may be blended for a densest filling structure. In order to maximize a shield effect by a permeability real component and a thermal conversion effect by a loss of a permeability imaginary component, the magnetic filler is more preferably formed by adding flat powder having an aspect ratio of 5 or more.

Preferably, the surface of the magnetic filler is insulation-coated by an oxide of a metal such as Si, Al, Ti, or Mg, or an organic material for enhancing fluidity, adhesion, and insulation performance. The insulation coating may be formed by coating a thermosetting material on the surface of the magnetic filler. Alternatively, an oxide film may be formed as the insulation coating by dehydration reaction of a metal alkoxide, and in this case, formation of a silicon oxide coating film is most preferable. More preferably, organic functional coupling treatment is applied to the formed coating film.

The composite magnetic material can be formed on the top surface 41 of the magnetic mold resin 40 using a known method such as a printing method, a molding method, a slit nozzle coating method, a spray method, a dispensing method, or a lamination method using an uncured sheet-like resin.

When the thin film formed of a soft magnetic material or a ferrite is selected as the magnetic film 50, one or two or more metals selected from a group consisting of Fe, Ni, Zn, Mn, Co, Cr, Mg, Al, and Si and oxides thereof may be used. In this case, the magnetic film 50 can be formed on the top surface 41 of the magnetic mold resin 40 by using a plating method, a spray method, an AD method, and a thermal spraying method, as well as a thin-film formation method such as a sputtering method or a vapor-deposition method. In this case, the material for the magnetic film 50 may be appropriately selected from a required permeability and frequency; however, in order to enhance a shield effect on a lower frequency side (kHz to 100 MHz), an Fe—Co alloy, an Fe—Ni alloy, an Fe—Al alloy, or an Fe—Si alloy is most preferably used. On the other hand, in order to enhance a shield effect on a higher frequency side (50 to several hundreds of MHz), a ferrite film formed of NiZn, MnZn, or NiCuZn, or Fe is most preferably used.

When a foil or a bulk sheet is used as the magnetic film 50, the foil or bulk sheet is previously set in a die for forming the magnetic mold resin 40. This allows the magnetic film 50 to be directly formed on the top surface 41 of the magnetic mold resin 40.

The top and side surfaces 51 and 52 of the magnetic film 40, the side surface 42 of the magnetic mold resin 40, and the side surface 27 of the substrate 20 are covered with the metal film 60. The metal film 60 serves as an electromagnetic shielding and is preferably mainly composed of at least one metal selected from a group consisting of Au, Ag, Cu, and Al. The metal film 60 preferably has a resistance as low as possible and most preferably uses Cu in terms of cost. An outer surface of the metal film 60 is preferably covered with an anticorrosive metal such as SUS, Ni, Cr, Ti, or brass or an antioxidant film 63 made of a resin such as an epoxy resin, a phenol resin, an imide resin, an urethane resin, or a silicone resin. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As illustrated in FIG. 1, the power supply patterns 25G are exposed to the side surfaces 27 of the substrate 20. The metal film 60 covers the side surfaces 27 of the substrate 20 and is thereby connected to the power supply pattern 25G.

Although not limited, it is preferable that a resistance value at an interface between the magnetic film 50 and the magnetic mold resin 40 is equal to or larger than $10^6 \Omega$. In this case, an eddy current generated when electromagnetic wave noise enters the metal film 60 hardly flows in the magnetic mold resin 40, which can prevent deterioration in the magnetic characteristics of the magnetic mold resin 40 due to inflow of the eddy current. The resistance value at the interface between the magnetic film 50 and the magnetic mold resin 40 refers to a surface resistance of the magnetic mold resin 40 when the metal film 60 and magnetic mold resin 40 directly contact each other and to a surface resistance of an insulating film when the insulating film is present between the metal film 60 and the magnetic mold resin 40. The resistance value at the interface between the metal film 60 and the magnetic mold resin 40 is preferably equal to or larger than $10^6 \Omega$ over the entire area of the interface; however, it does not matter if the resistance value is partly smaller than $10^6 \Omega$.

Basically, the surface resistance value of the magnetic mold resin 40 substantially coincides with the volume resistivity of the magnetic mold resin 40. Thus, basically, when the volume resistivity of the magnetic mold resin 40 is equal to or larger than $10^{10}$ Ωcm, the surface resistance value of the magnetic mold resin 40 is also equal to or larger than $10^{10} \Omega$. However, as described later, the magnetic mold resin 40 undergoes dicing at manufacturing, so that the magnetic filler made of a soft magnetic metal may be exposed to a cut surface (i.e., side surface 42), and in this case, the surface resistance value of the side surface 42 becomes smaller than the volume resistivity. Similarly, when the top surface 41 of the magnetic mold resin 40 is ground for reducing height or roughing the surface, the magnetic filler made of a soft magnetic metal may be exposed to the top surface 41, and in this case, the surface resistance value of the top surface 41 becomes smaller than the volume resistivity. As a result, even when the volume resistivity of the magnetic mold resin 40 is equal to or larger than $10^{10}$ Ωcm, the surface resistance value of the magnetic mold resin 40 may be smaller than $10^{10} \Omega$; however, in such a case, when the surface resistance value of the magnetic mold resin 40 is equal to or larger than $10^6\Omega$, it is possible to prevent inflow of the eddy current.

When the surface resistance value of the top surface 41 or side surface 42 of the magnetic mold resin 40 is reduced to smaller than $10^6\Omega$, a thin insulating material may be formed on the top surface 41 or side surface 42 of the magnetic mold resin 40. With this configuration, even when the surface resistance value of the top surface 41 or side surface 42 of the magnetic mold resin 40 is reduced to smaller than $10^6\Omega$, the resistance value at the interface between the magnetic film 50 and the magnetic mold resin 40 can be made equal to or larger than $10^6\Omega$, making it possible to prevent deterioration in the magnetic characteristics due to the eddy current.

In addition, it is desirable that a resistance value at an interface between the metal film 60 and the magnetic film 50 is also equal to or larger than $10^6\Omega$. According to this configuration, an eddy current generated when electromagnetic wave noise enters the metal film 60 hardly flows in the magnetic film 50, which can prevent deterioration in the magnetic characteristics of the magnetic film 50 due to inflow of the eddy current. The resistance value at the interface between the metal film 60 and the magnetic film 50 refers to a surface resistance of the magnetic film 50 when the metal film 60 and magnetic film 50 directly contact each other and to a surface resistance of an insulating film when the insulating film is present between the metal film 60 and the magnetic film 50.

Figure 2:
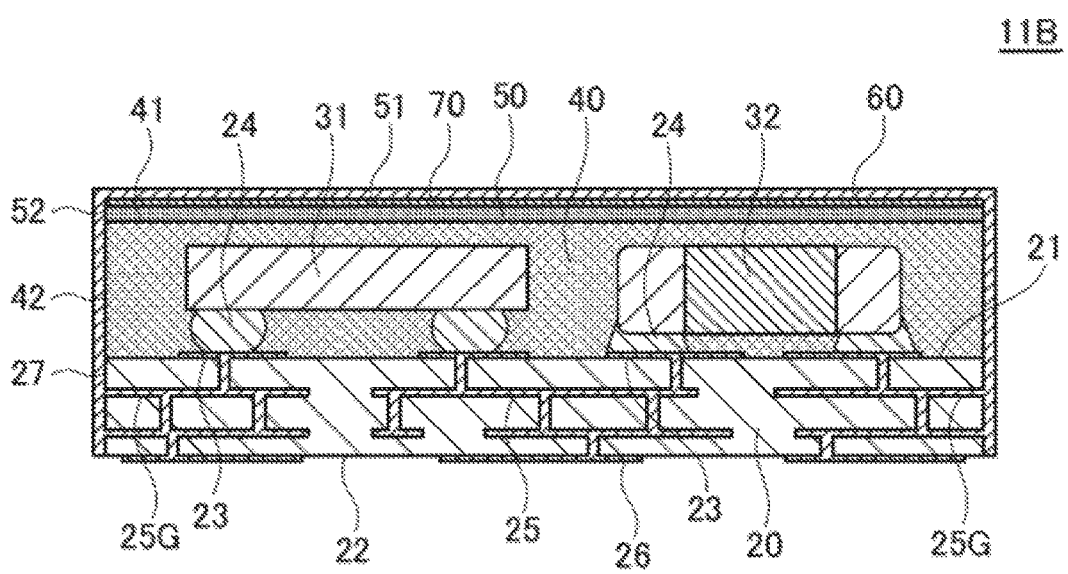
FIG. 2 is a cross-sectional view illustrating a configuration of an electronic circuit package according to a first modification of the first embodiment.

In order to make a resistance value at an interface between the metal film 60 and the magnetic film 50 equal to or higher than $10^6\Omega$, a material having a sufficiently high surface resistance is used as the material for the magnetic film 50 or a thin insulating material is formed on the top surface 51 of the magnetic film 50. FIG. 2 is a cross-sectional view illustrating a configuration of an electronic circuit package 11B according to a modification. The electronic circuit package 11B of FIG. 2 differs from the electronic circuit package 11A of FIG. 1 in that a thin insulating adhesive film 70 is interposed between the magnetic film 50 and the metal film 60. By interposing the insulating adhesive film 70, it is possible to make a resistance value at an interface between the metal film 60 and the magnetic film 50 equal to or higher than $10^6\Omega$ even when a material having a comparatively low resistance value is used as the material for the magnetic film 50, thereby making it possible to prevent deterioration in magnetic characteristics due to an eddy current. In addition, the insulating adhesive film 70 can also improve adhesiveness of the metal film 60.

Figure 3:
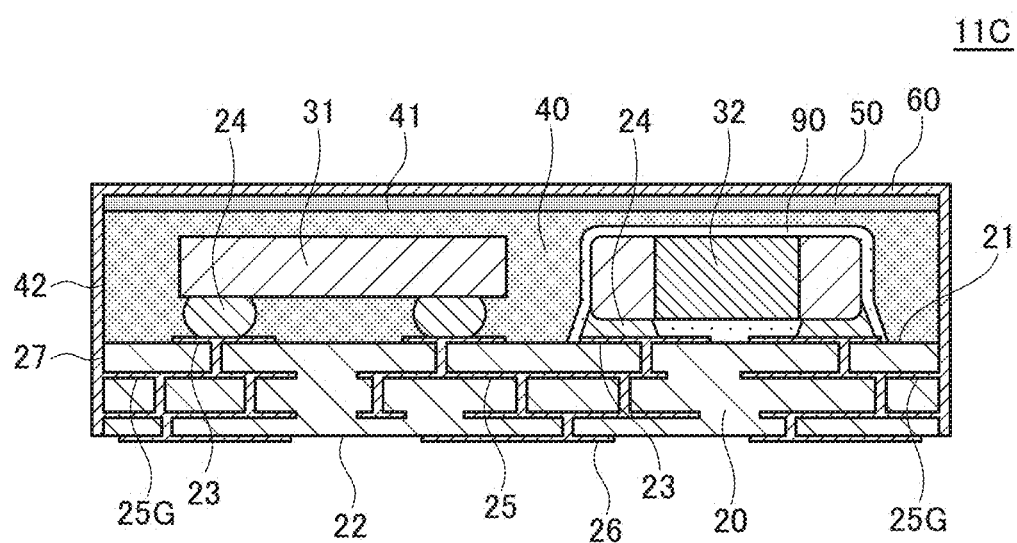
FIG. 3 is a cross-sectional view illustrating a configuration of an electronic circuit package according to a second modification of the first embodiment.

Further, when a distance between an electronic component such as a high-frequency inductor and the magnetic mold resin 40 is too small, characteristics thereof such as an inductance value may fluctuate from a design value. In such a case, the fluctuation of the characteristics can be reduced by covering a part of or the entire electronic component with a non-magnetic member. FIG. 3 is a cross-sectional view illustrating a configuration of an electronic circuit package 11C according to a second modification. The electronic circuit package 11C of FIG. 3 differs from the electronic circuit package 11A of FIG. 1 in that the electronic component 32 is covered with a non-magnetic member 90. As the non-magnetic member 90, a common resin can be used. By interposing the non-magnetic member 90 between the electronic component 32 and the magnetic mold resin 40, a sufficient distance between the electronic component 32 and magnetic mold resin 40 can be ensured, so that it is possible to reduce the fluctuation of characteristics such as the inductance value.

As described above, the electronic circuit packages 11A to 11C according to the present embodiment use the magnetic mold resin 40 and have the surfaces covered with a laminated film of the magnetic film 50 and the metal film 60. With this configuration, it is possible to obtain a composite triple-shield structure without using a magnetic film and the like in addition to the mold resin. This can effectively shield electromagnetic wave noise radiated from the electronic components 31 and 32 and external electromagnetic wave noise entering the electronic components 31 and 32 while achieving reduction in height. In particular, the electronic circuit packages 11A to 11C according to the present embodiment can shield the electromagnetic wave noise radiated from the electronic components 31 and 32 more effectively. This is because the electromagnetic wave noise radiated from the electronic components 31 and 32 is partly absorbed when it passes through the magnetic mold resin 40 and the magnetic film 50, and the remaining electromagnetic wave noise that has not been absorbed is reflected by the metal film 60 and passes through the magnetic film 50 and the magnetic mold resin 40 once again. As described above, the magnetic mold resin 40 acts on the incident electromagnetic wave noise twice, thereby effectively shielding the electromagnetic wave noise radiated from the electronic components 31 and 32.

In addition, the magnetic film 50 has a higher effective permeability than the magnetic mold resin 40, so that it is possible to achieve higher electromagnetic wave noise absorption effect than in a case where the magnetic film 50 is absent. This effect becomes obvious when the effective permeability of the magnetic film 50 is double or more that of the magnetic mold resin 40.

The following describes a manufacturing method for the electronic circuit package 11A according to the present embodiment.

FIGS. 4 to 7 are process views for explaining a manufacturing method for the electronic circuit package 11A.

Figure 4:
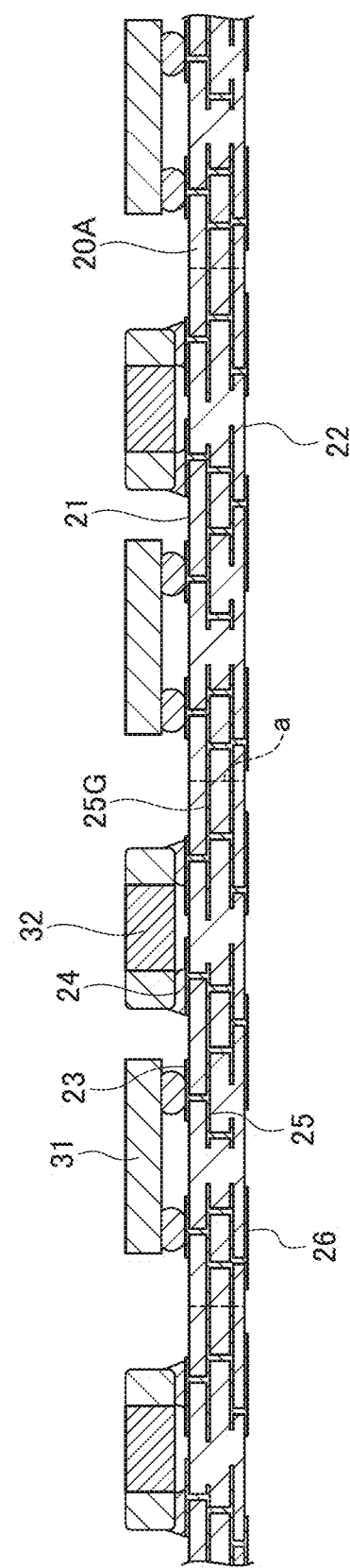
FIGS. 4 to 7 are process views for explaining a manufacturing method for the electronic circuit package shown in FIG. 1.

As illustrated in FIG. 4, an assembly substrate 20A having a multilayer wiring structure is prepared. A plurality of the land patterns 23 are formed on the front surface 21 of the assembly substrate 20A, and a plurality of the external terminals 26 are formed on the back surface 22 of the assembly substrate 20A. Further, a plurality of the internal wirings 25 including the power supply patterns 25G are formed in an inner layer of the assembly substrate 20A. A dashed line a in FIG. 4 denotes apart to be cut in a subsequent dicing process. As illustrated in FIG. 4, the power supply patterns 25G are provided at a position overlapping the dashed line a in a plan view.

Then, as illustrated in FIG. 4, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Figure 5:
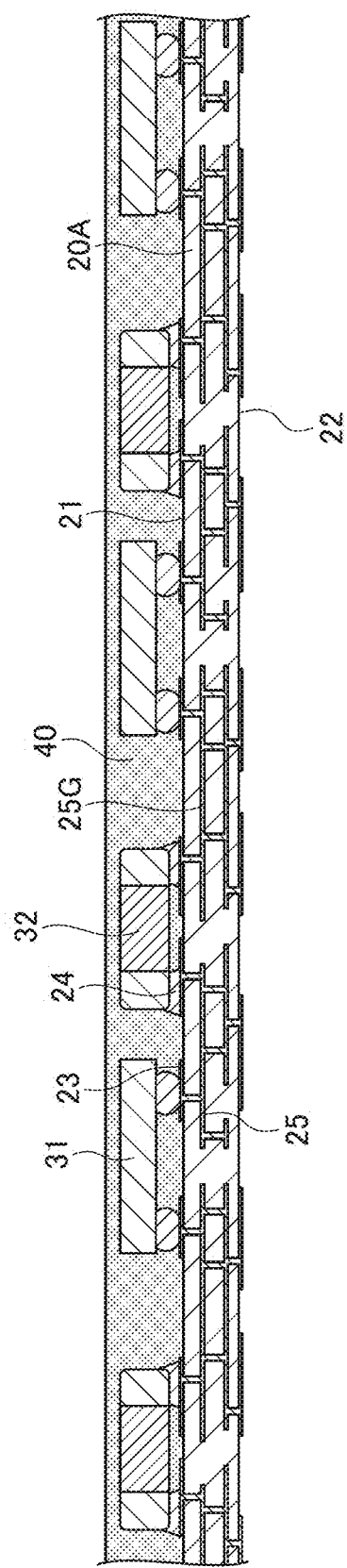

Then, as illustrated in FIG. 5, the front surface 21 of the assembly substrate 20A is covered with the magnetic mold resin 40 having a volume resistivity equal to or larger than $10^{10}\Omega$ so as to embed the electronic components 31 and 32 in the magnetic mold resin 40. Examples of the formation method for the magnetic mold resin 40 may include, as described above, transfer molding, compression molding, injection molding, cast molding, vacuum cast molding, dispense molding, and molding using a slit nozzle.

Figure 6:
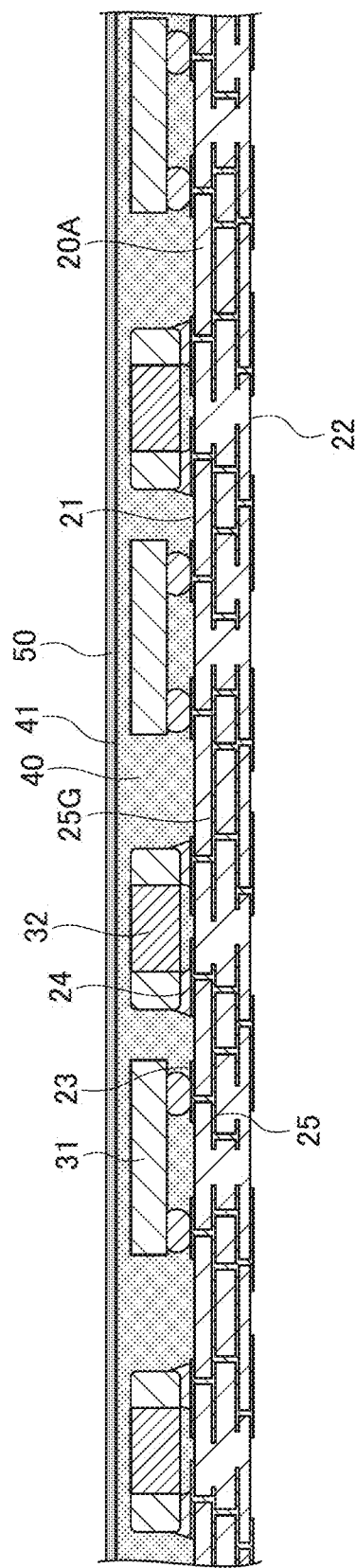

Then, as illustrated in FIG. 6, the magnetic film 50 is formed on the top surface 41 of the magnetic mold resin 40. In this case, in order to enhance adhesion between the magnetic mold resin 40 and magnetic film 50, the top surface 41 of the magnetic mold resin 40 may be subjected to blast treatment or etching treatment to forma physical unevenness thereon, subjected to surface modification by plasma or short-wavelength UV irradiation, or subjected to organic functional coupling treatment.

When the film formed of a composite magnetic material is used as the magnetic film 50, a thick-film formation method such as a printing method, a molding method, a slit nozzle coating method, a spray method, a dispensing method, an injection method, a transfer method, a compression molding method, or a lamination method using an uncured sheet-like resin can be used. When the magnetic film 50 is formed by using the printing method, slit nozzle method, spraying method, or dispensing method, the viscosity of the composite magnetic material is preferably controlled as needed. The viscosity control may be made by diluting the composite magnetic material with one or two or more solvents having a boiling point of 50° C. to 300° C. The thermosetting material mainly consists of a main agent, a curing agent, and a curing accelerator; however, two or more kinds of main agent or curing agent may be blended according to required characteristics. Further, two or more kinds of solvents may be mixed: a coupling agent for enhancing adhesion and fluidity, a fire retardant for flame retardancy, a dye and a pigment for coloration, a non-reactive resin material for imparting flexibility, and a non-magnetic filler for adjusting a thermal expansion coefficient may be blended. The materials may be kneaded or dispersed by a known means such as a kneader, a mixer, a vacuum defoaming stirring machine, or a three-roll mill.

When the thin film formed of a soft magnetic material or a ferrite is used as the magnetic film 50, a plating method, a spray method, an AD method, and a thermal spraying method, as well as a thin-film formation method such as a sputtering method or a vapor-deposition method may be used. When a foil or a bulk sheet is used as the magnetic film 50, the foil or bulk sheet is previously set in a die for forming the magnetic mold resin 40. This allows the magnetic film 50 to be directly formed on the top surface 41 of the magnetic mold resin 40.

Figure 7:
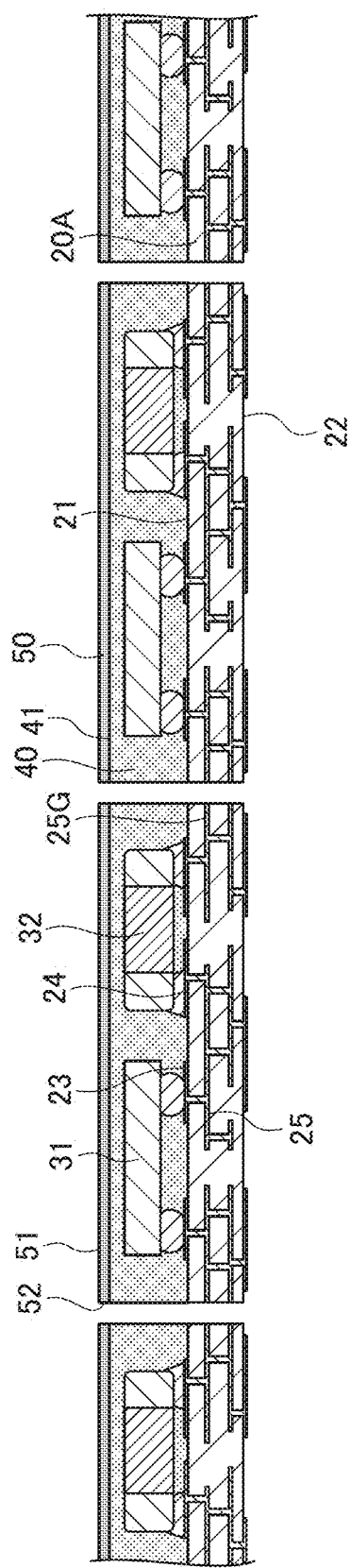

Then, as illustrated in FIG. 7, the assembly substrate 20A is cut along the dashed line a to divide the assembly substrate 20A into individual substrates 20. In the present embodiment, the power supply patterns 25G pass the dashed line a as a dicing position. Thus, when the assembly substrate 20A is cut along the dashed line a, the power supply patterns 25G are exposed from the side surface 27 of the substrate 20.

Then, the metal film 60 is formed so as to cover the top and side surfaces 51 and 52 of the magnetic film 50, the side surface 42 of the magnetic mold resin 40, and side surface 27 of the substrate 20, whereby the electronic circuit package 11A according to the present embodiment is completed. Examples of a formation method for the metal film 60 may include a sputtering method, a vapor-deposition method, an electroless plating method, and an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film or a chromium film may be formed thinly in advance.

Further, when the adhesive film 70 is interposed between the magnetic film 50 and the metal film 60 as in the modification illustrated in FIG. 2, a thermosetting material, a heat-resistance thermoplastic material, or an adhesive material such as an oxide of Si or a low-melting-point glass may be formed thinly on the top surface 51 and/or side surface 52 of the magnetic film 50 before formation of the metal film 60.

As described above, according to the manufacturing method for the electronic circuit package 11A of the present embodiment, the top surface 41 of the magnetic mold resin 40 can be covered with a laminated film of the magnetic film 50 and the metal film 60.

Second Embodiment

Figure 8:
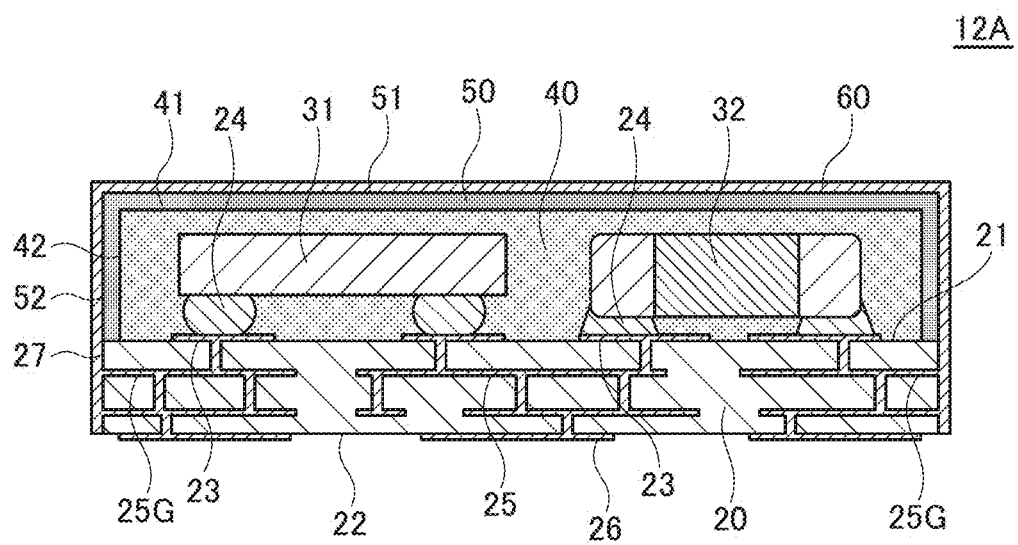
FIG. 8 is a cross-sectional view illustrating a configuration of an electronic circuit package according to a second embodiment of the present invention.

FIG. 8 is a cross-sectional view illustrating a configuration of an electronic circuit package 12A according to the second embodiment of the present invention.

As illustrated in FIG. 8, the electronic circuit package 12A according to the present embodiment differs from the electronic circuit package 11A of FIG. 1 according to the first embodiment in that the magnetic film 50 covers not only the top surface 41 of the magnetic mold resin 40, but also the side surface 42. Other configurations are the same as those of the electronic circuit package 11A according to the first embodiment. Thus, in FIG. 8, the same reference numerals are given to the same elements as in FIG. 1, and repeated descriptions will be omitted.

In the present embodiment, the side surface 42 of the magnetic mold resin 40 is fully covered with the magnetic film 50, and thus, a part where the magnetic mold resin 40 and metal film 60 contact each other does not substantially exist. With this configuration, a composite-shield effect in the side surface of the magnetic mold resin 40 can be enhanced. In particular, electromagnetic noise radiated in a side surface direction of the magnetic mold resin 40 is effectively shielded.

Figure 9:
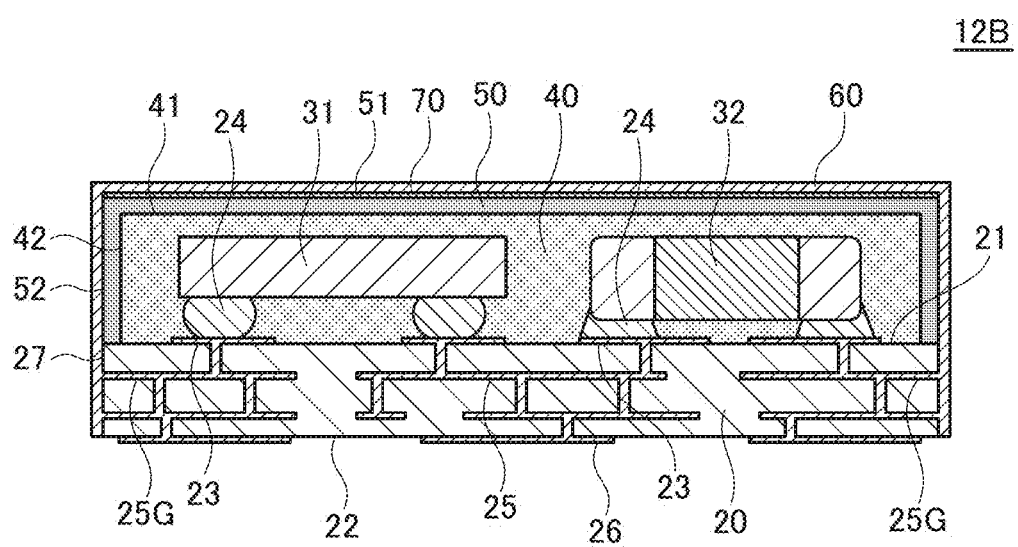
FIG. 9 is a cross-sectional view illustrating a configuration of an electronic circuit package according to a first modification of the second embodiment.
Figure 10:
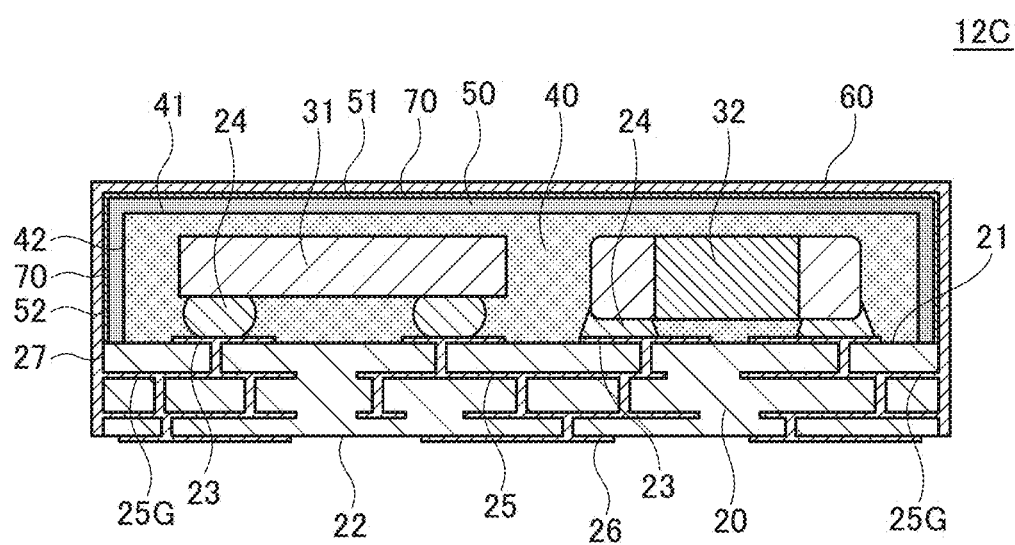
FIG. 10 is a cross-sectional view illustrating a configuration of an electronic circuit package according to a second modification of the second embodiment.

When a material having a comparatively low resistance value is used as the material for the magnetic film 50, the thin adhesive film 70 is preferably interposed between the top surface 51 of the magnetic film 50 and the metal film 60 as in an electronic circuit package 12B of FIG. 9 according to a modification, and more preferably, the thin adhesive film 70 is interposed between the top surface 51 and side surface 52 of the magnetic film 50 and the metal film 60 as in an electronic circuit package 12C of FIG. 10 according to another modification.

Figure 11:
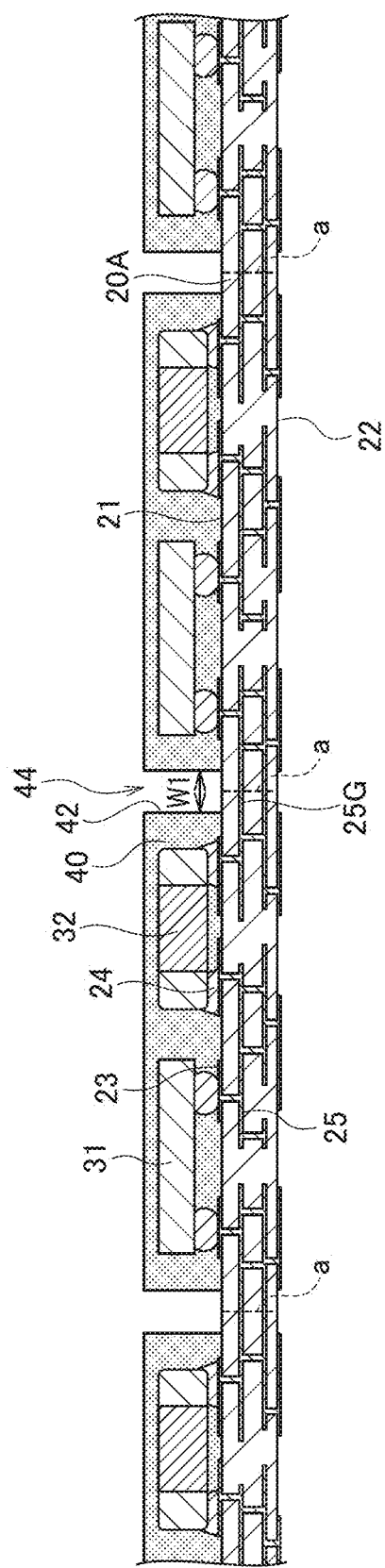
FIGS. 11 to 13 are process views for explaining a manufacturing method for the electronic circuit package shown in FIG. 8.
Figure 12:
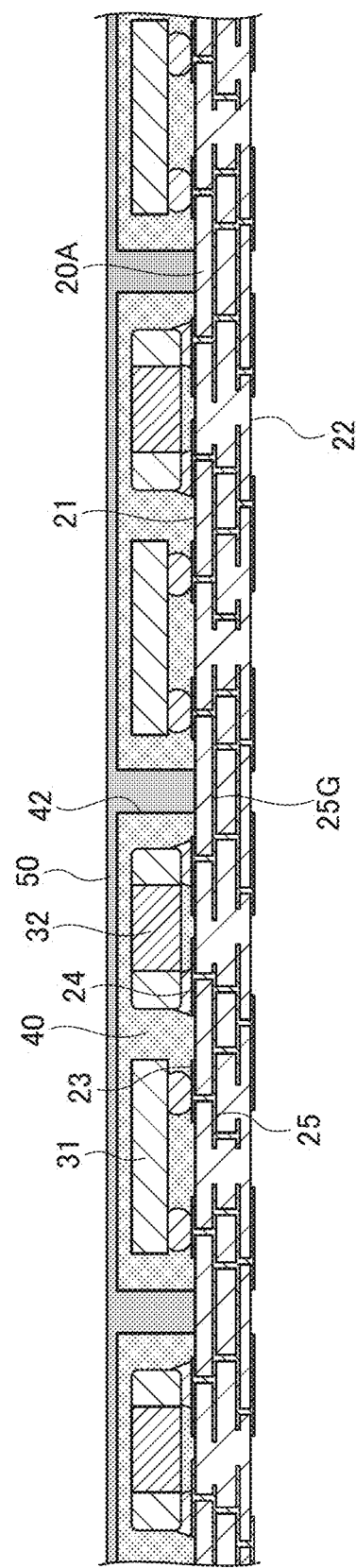
Figure 13:
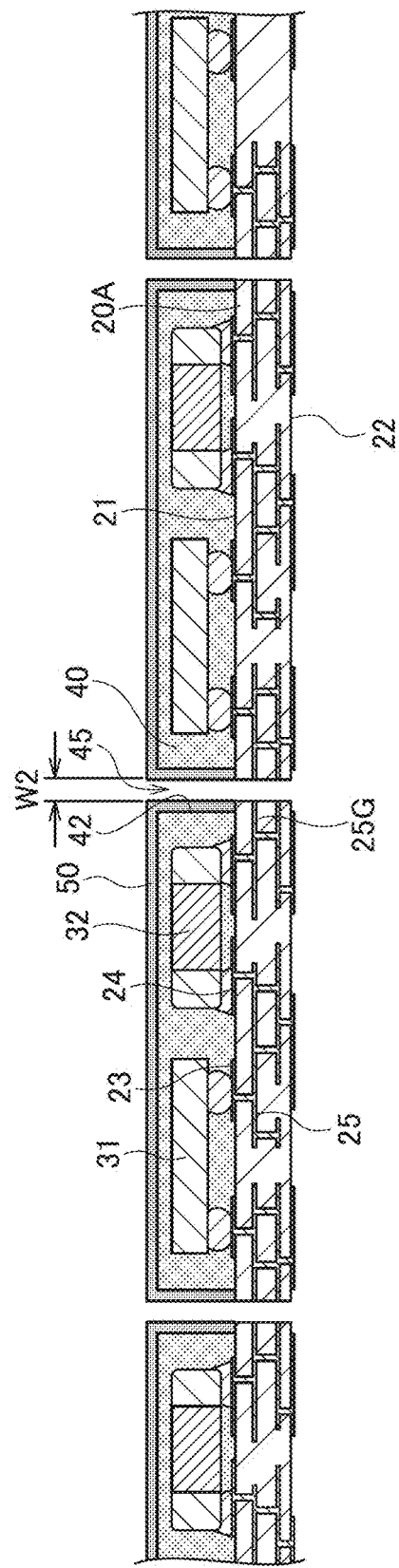

FIGS. 11 to 13 are process views for explaining a manufacturing method for the electronic circuit package 12A.

First, the magnetic mold resin 40 is formed by the method described using FIGS. 4 and 5. Then, as illustrated in FIG. 11, a groove 44 having a width W1 is formed along a dashed line a indicating a dicing position. The groove 44 has a depth almost completely cutting the magnetic mold resin 40 and not reaching the inner wiring 25 formed in the substrate 20. As a result, the side surface 42 of the magnetic mold resin 40 and the surface 21 of the substrate 20 are exposed inside the groove 44.

Then, as illustrated in FIG. 12, the magnetic film 50 is formed to fill the groove 44. Although it is not essential to completely fill the groove 44 with the magnetic film 50, when the groove 44 is filled with the magnetic film 50, the magnetic film needs to have a certain film thickness, so that it is necessary to use the composite magnetic material as the magnetic film 50. Thus, the magnetic film 50 is directly formed on the top surface 41 and side surface 42 of the magnetic mold resin 40, and the surface 21 of the substrate 20 exposed to the bottom of the groove 44 is also covered with the magnetic film 50. Further, as in the modification illustrated in FIG. 9, when the adhesive film 70 is interposed between the top surface 51 of the magnetic film 50 and the metal film 60, after formation of the magnetic film 50, an adhesive material such as a thermosetting material or a heat-resistant thermoplastic material may be thinly formed on the top surface 51 of the magnetic film 50.

Then, as illustrated in FIG. 13, a groove 45 having a width W2 is formed along the dashed line a to cut the assembly substrate 20A into a plurality of substrates 20. At this time, The width W2 of the groove 45 needs to be smaller than the width W1 of the groove 44. As a result, the substrate 20A is segmented into individual substrates 20 with the magnetic film 50 formed inside the groove 44 remaining. Further, as in the modification illustrated in FIG. 10, when the adhesive film 70 is interposed between the top surface 51 and side surface 52 of the magnetic film 50 and the metal film 60, the side surface 52 of the magnetic film 50 is exposed by formation of the groove 45 without segmentation of the assembly substrate 20A, then an adhesive material such as a thermosetting material or a heat-resistant thermoplastic material is thinly formed on the top surface 51 and side surface 52 of the magnetic film 50, followed by cutting of the assembly substrate 20A.

Then, the metal film 60 is formed so as to cover the top surface 51 and side surface 52 of the magnetic film 50 and the side surface 27 of the substrate 20, whereby the electronic circuit package 12A according to the present embodiment is completed.

As described above, in the manufacturing method for the electronic circuit package 12A according to the present embodiment, the two grooves 44 and 45 having different widths are sequentially formed, whereby the side surface 42 of the magnetic mold resin 40 can be covered with the magnetic film 50 without use of a complicated process.

Third Embodiment

Figure 14:
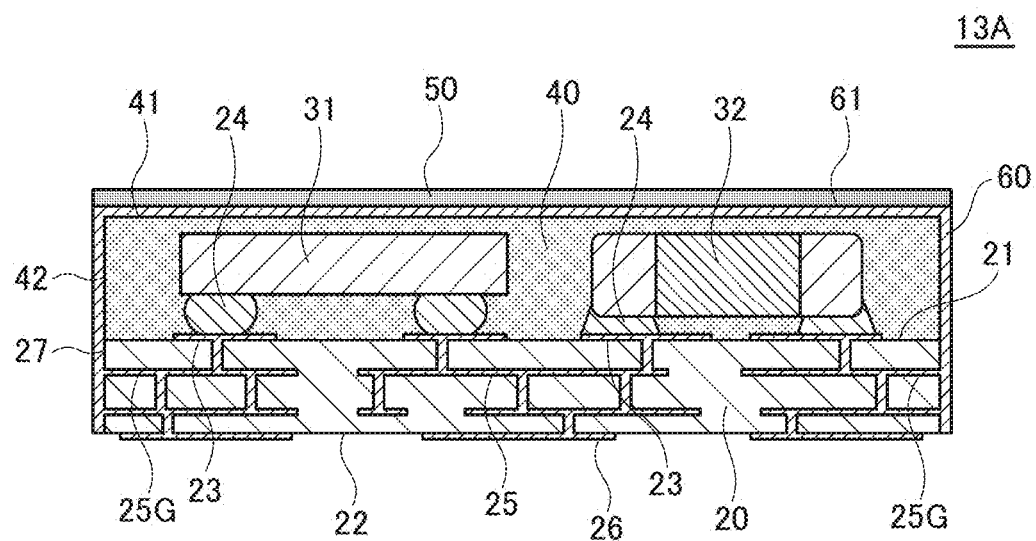
FIG. 14 is a cross-sectional view illustrating a configuration of an electronic circuit package according to a third embodiment of the present invention.

FIG. 14 is a cross-sectional view illustrating a configuration of an electronic circuit package 13A according to a third embodiment of the present invention.

As illustrated in FIG. 14, the electronic circuit package 13A according to the present embodiment differs from the electronic circuit package 11A illustrated in FIG. 1 in that the magnetic film 50 is formed on an upper surface 61 of the metal film 60. That is, the positional relationship between the magnetic film 50 and the metal film 60 constituting the laminated film is reversed. Other configurations are the same as those of the electronic circuit package 11A illustrated in FIG. 1. Even with this configuration, high composite shielding effect can be achieved since a triple-shield structure composed of the magnetic mold resin 40, magnetic film 50, and metal film 60 can be obtained.

Figure 15:
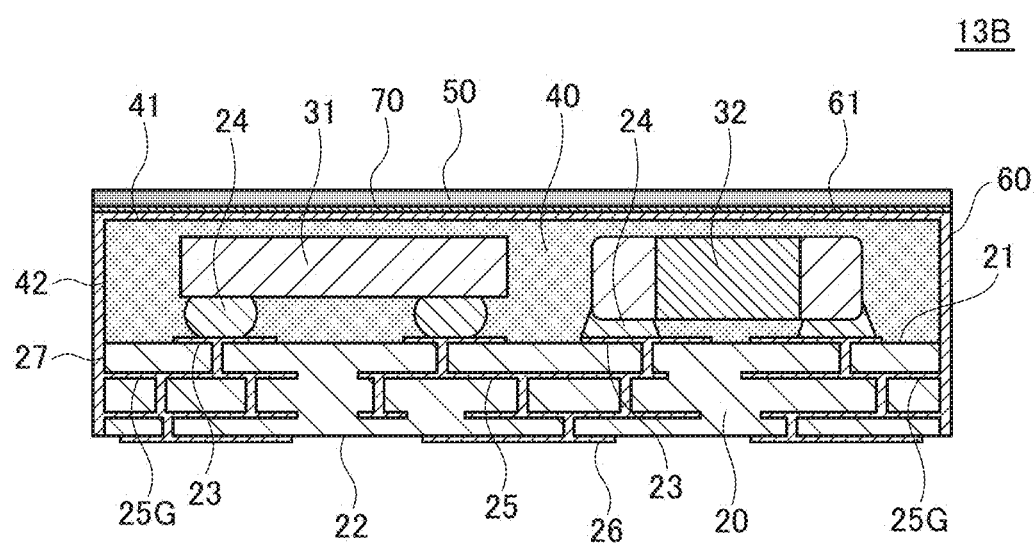
FIG. 15 is a cross-sectional view illustrating a configuration of an electronic circuit package according to a modification of the third embodiment.

When it is difficult to directly form the magnetic film 50 on the upper surface 61 of the metal film 60, a thin adhesive layer 70 can be interposed between the metal film 60 and the magnetic film 50 as in an electronic circuit package 13B according to a modification illustrated in FIG. 15. When the magnetic film 50 functions as an oxidation preventing coating for the metal film 60, it is not necessary to apply the oxidation preventing coating onto the upper surface 61 of the metal film 60; however, the oxidation preventing coating is preferably applied onto the upper surface 61 of the metal film 60 so as to enhance reliability.

Figure 16:
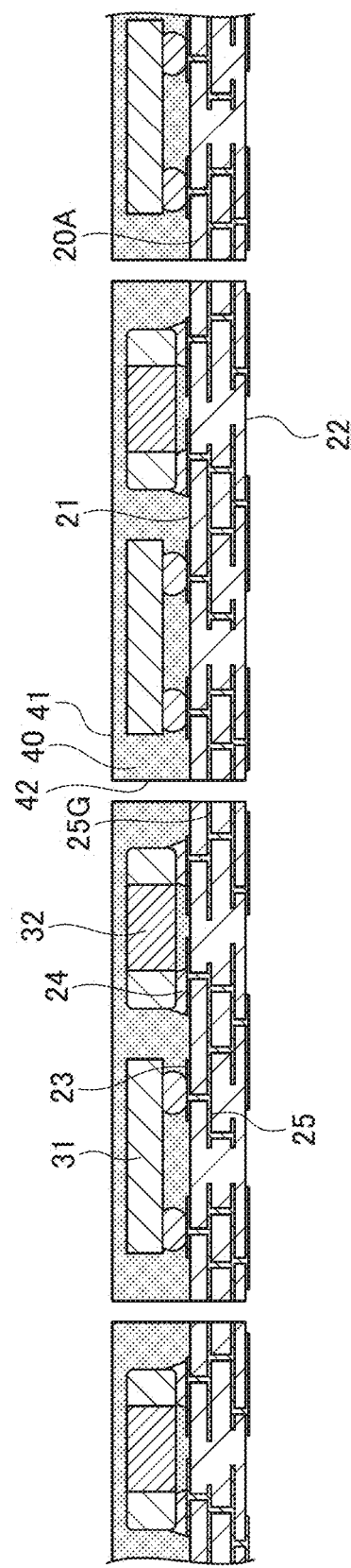
FIGS. 16 and 17 are process views for explaining a manufacturing method for the electronic circuit package shown in FIG. 14.
Figure 17:
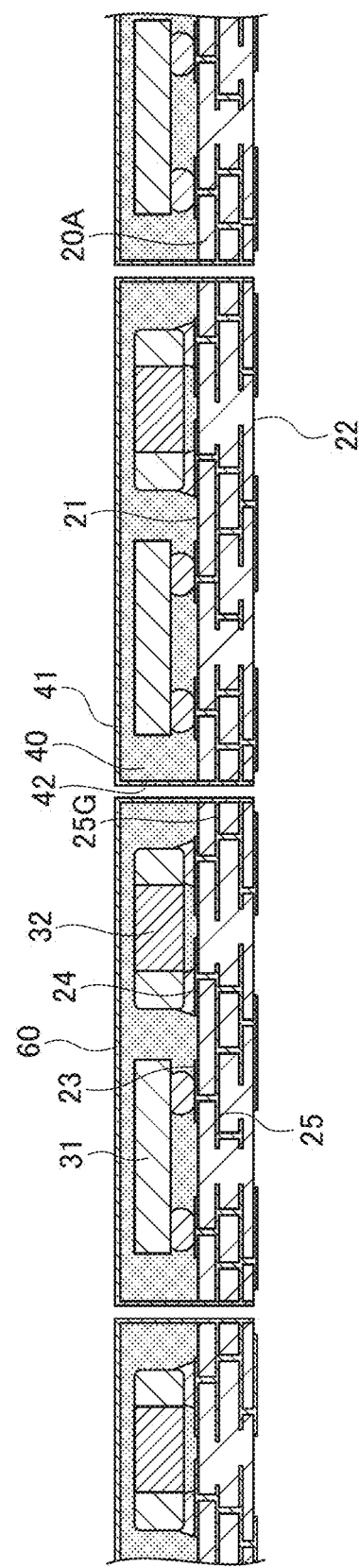

FIGS. 16 and 17 are process views for explaining a manufacturing method of the electronic circuit package 13A.

First, the magnetic mold resin 40 is formed according to the method described using FIGS. 4 and 5. Then, as illustrated in FIG. 16, the aggregated substrate 20A is cut off along a dashed line a indicating a dicing position to individuate the substrate 20 (see FIG. 4).

Then, as illustrated in FIG. 17, the metal film 60 is formed so as to cover the upper surface 41 and side surface 42 of the magnetic mold resin 40 and the side surface 27 of the substrate 20. As a result, the metal film 60 is connected to the power supply pattern 25G exposed to the side surface 27 of the substrate 20. Then, the magnetic film 50 is formed on the upper surface 61 of the metal film 60, whereby the electronic circuit package 13A illustrated in FIG. 14 is completed. When it is difficult to directly form the magnetic film 50 on the upper surface 61 of the metal film 60, an adhesive material such as a thermosetting material or a heat-resistant thermoplastic material is thinly formed after formation of the metal film 60 and before formation of the magnetic film 50. In this case, the electronic circuit package 13B illustrated in FIG. 15 is obtained.

Fourth Embodiment

Figure 18:
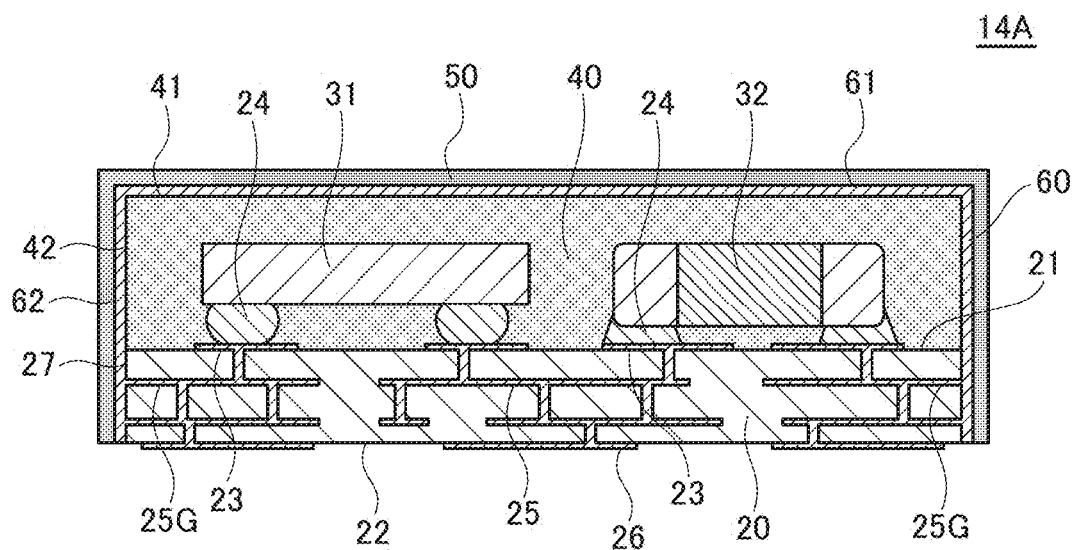
FIG. 18 is a cross-sectional view illustrating a configuration of an electronic circuit package according to a fourth embodiment of the present invention.

FIG. 18 is a cross-sectional view illustrating a configuration of an electronic circuit package 14A according to a fourth embodiment of the present invention.

As illustrated in FIG. 18, the electronic circuit package 14A according to the present embodiment differs from the electronic circuit package 13A illustrated in FIG. 14 in that the magnetic film 50 is formed not only on the upper surface 61 of the metal film 60, but also on a side surface 62 thereof. Other configurations are the same as those of the electronic circuit package 13A illustrated in FIG. 14.

Thus, the same reference numerals are given to the same elements, and overlapping description will be omitted. With this configuration, composite shielding effect on the side surface of the magnetic mold resin 40 can be enhanced. In particular, electromagnetic wave noise to be incident from the side direction of the magnetic mold resin 40 can be effectively shielded.

Figure 19:
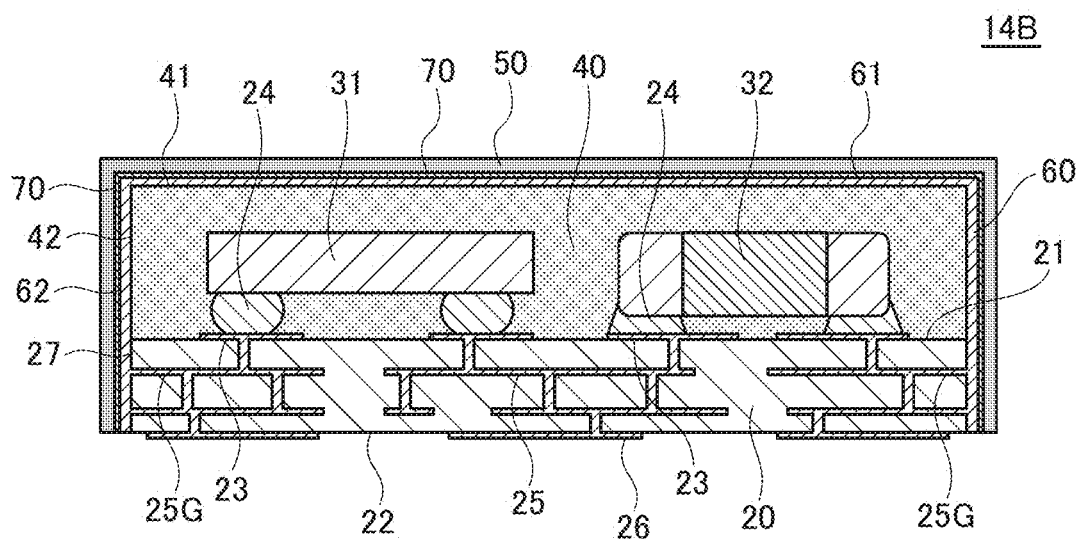
FIG. 19 is a cross-sectional view illustrating a configuration of an electronic circuit package according to a modification of the fourth embodiment.

When it is difficult to directly form the magnetic film 50 on the upper surface 61 and side surface 62 of the metal film 60, a thin adhesive layer 70 is interposed between the upper surface 61 and side surface 62 of the metal film 60 and the magnetic film 50 as in an electronic circuit package 14B according to a modification illustrated in FIG. 19. When the magnetic film 50 functions as an oxidation preventing coating for the metal film 60, it is not necessary to apply the oxidation preventing coating onto the upper surface 61 and side surface 62 of the metal film 60; however, the oxidation preventing coating is preferably applied onto the upper surface 61 and side surface 62 of the metal film 60 in view of reliability enhancement.

While the preferred embodiments of the present invention have been described, the present invention is not limited thereto. Thus, various modifications may be made without departing from the gist of the invention, and all of the modifications thereof are included in the scope of the present invention.

EXAMPLES

<Formation of Magnetic Filler>

First, AKT4.5Si-5.0Cr (D50=30 μm) manufactured by Mitsubishi Steel MFG. Co. Ltd and Carbonyl iron powder (D50=6 μm) manufactured by BASF were prepared, and an $SiO_2$ coating was applied by the hydrolysis of metal alkoxide. A film thickness of the $SiO_2$ coating was 30 nm. The film thickness was observed by using an FE-SEM.

<Formation of Composite Magnetic Material>

Then, AKT4.5Si-5.0Cr (D50=30 μm) and Carbonyl iron powder were measured such that a weight ratio thereof becomes 8:2, and 90 wt % of the obtained mixture were added to a thermosetting resin. The thermosetting resin and solvent used were as follows: HP-7200H (dicyclopentadiene type epoxy resin) manufactured by DIC. Co., Ltd. as a main agent; TD2231 (phenol novolac) manufactured by DIC. Co., Ltd. as a curing agent; 2 wt % of U-CAT SA841 (DBU-phenol novolak resin salt) manufactured by Sun-Apro Co., Ltd. relative to the main agent, as a curing accelerator. These agents were blended, and heated and kneaded using a kneader, whereby the composite magnetic material was obtained.

<Production of Noise Attenuation Measurement Sample>

[Production of Sample A1]

The above composite magnetic material was formed by molding on a substrate for shield evaluation having a 50Ω, resistor mounted thereon according to a compression molding method, whereby the 50Ω resistor was covered with a magnetic mold resin. Thereafter, a permalloy foil having a thickness of 12 μm was adhered onto the upper surface of the magnetic mold resin, and an insulating layer was formed on the surface of the permalloy foil. Then, a dicer was used to individuate the substrate to thereby expose a ground pattern to the side surface of the substrate. Then, a metal film composed of Cu was formed by electroless plating on the upper surface and side surface of the permalloy foil, the side surface of the magnetic mold resin, and the side surface of the substrate so as to contact the ground pattern, whereby the sample A1 was obtained. The film thickness of the metal film was set in a range of 0 μm to 7 μm. The sample A1 has a configuration similar to that of the electronic circuit package 11A illustrated in FIG. 1.

[Production of Sample B1]

A sample B1 was produced in the same manner as for the sample A1 except that G-770H which is a common semiconductor sealing material and manufactured by Sumitomo Bakelite Co., Ltd. was used as a molding material. Thus, in the sample B1, the 50Ω, resistor is molded by a non-magnetic mold resin.

[Production of Sample B2]

A sample B2 was produced in the same manner as for the sample B1 except that the permalloy foil and the insulating layer on the permalloy layer were omitted.

<Measurement of Noise Attenuation>

The noise attenuation measurement samples A1, B1, and B2 were each connected to a signal generator, and a signal of 20 MHz was transmitted to the 50Ω resistor, whereby the amount of noise radiated from each sample was measured by a neighboring magnetic field measuring apparatus. On the other hand, a reference sample was previously formed in which the magnetic molding resin, magnetic film (permalloy foil), and metal film are omitted, and the amount of noise radiated from the reference sample was measured. Then, a difference between the noise amount in the reference sample and the noise amount of each of the measurement samples A1, B1, and B2 was calculated as the noise attenuation. The measurement results are illustrated in FIG. 20.

Figure 20:
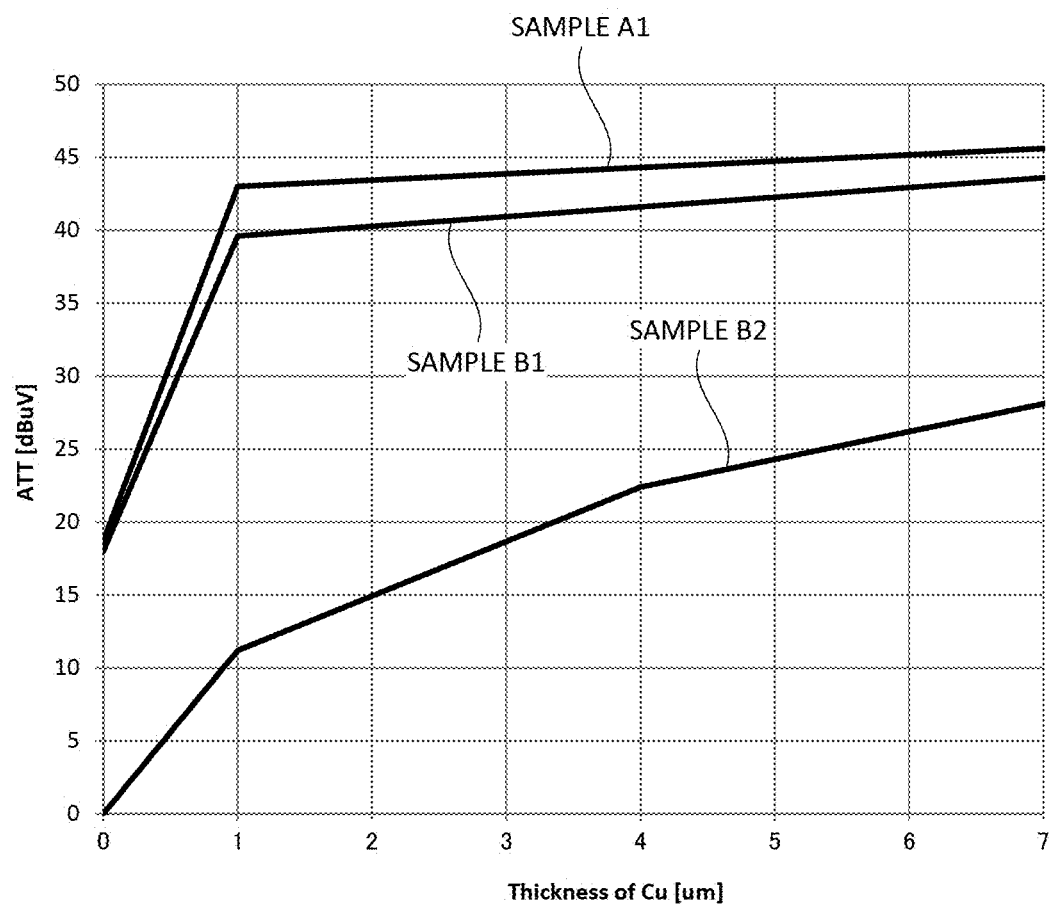
FIG. 20 is a graph indicating measurement results of examples.

As illustrated in FIG. 20, the sample A1 having a triple-shield structure composed of the magnetic mold resin, magnetic film (permalloy foil) and metal film achieve higher noise attenuation than the sample B1 having a double-shield structure composed of the magnetic film (permalloy foil) and metal film and the sample B2 having a single-shield structure composed of only the metal film.

Thus, it is confirmed that an electronic circuit package having the triple-shield structure has high shielding characteristics. In addition, even when the thickness of the metal film is as small as, e.g., 1 μm, the sample A1 having the triple-shield structure has high shielding characteristics.

What is claimed is:

1. An electronic circuit package comprising:
   a substrate having a main surface, a side surface and a power supply pattern exposed to the side surface, the main surface including first and second areas;
   a first electronic component mounted on the first area of the main surface of the substrate;
   a second electronic component mounted on the second area of the main surface of the substrate;
   a magnetic mold resin that covers the main surface of the substrate so as to embed the first and second electronic components therein, the magnetic mold resin comprising a composite magnetic material containing a thermosetting resin material and a magnetic filler;
   a laminated film including at least a metal film and a magnetic film, the laminated film covering at least a top surface of the magnetic mold resin; and
   a non-magnetic member covering the second electronic component without covering the first electronic component such that the non-magnetic member is provided between the second electronic component and the magnetic mold resin and such that the second electronic component does not contact the magnetic mold resin,
   wherein the first electronic component contacts the magnetic mold resin,
   wherein the metal film of the laminated film extends over the side surface of the substrate to cover and connect to the power supply pattern exposed to the side surface of the substrate, without an intervention of the metal film, and
   wherein the magnetic film has a higher effective permeability than that of the magnetic mold resin.

2. The electronic circuit package as claimed in claim 1, wherein the laminated film further covers a side surface of the magnetic mold resin.

3. The electronic circuit package as claimed in claim 1, wherein the magnetic film is positioned between the magnetic mold resin and the metal film.

4. The electronic circuit package as claimed in claim 1, wherein the metal film is positioned between the magnetic mold resin and the magnetic film.

5. The electronic circuit package as claimed in claim 1, wherein the laminated film further includes an adhesive layer formed between the metal film and the magnetic film.

6. The electronic circuit package as claimed in claim 5, wherein a resistance value of the adhesive layer is $10^6 \Omega$ or higher.

7. The electronic circuit package as claimed in claim 5, wherein the effective permeability of the magnetic film is double or more the effective permeability of the magnetic mold resin.

8. The electronic circuit package as claimed in claim 1, wherein a volume resistivity of the magnetic mold resin is equal to or larger than $10^{10}\Omega$, and a resistance value at an interface between the top surface of the magnetic mold resin and the laminated film is equal to or larger than $10^6\Omega$.

9. The electronic circuit package as claimed in claim 1, wherein the magnetic filler includes a soft magnetic metal.

10. The electronic circuit package as claimed in claim 9, wherein a surface of the magnetic filler is coated by an insulation coat.

11. The electronic circuit package as claimed in claim 10, wherein a film thickness of the insulation coat is equal to or larger than 10 nm.

12. The electronic circuit package as claimed in claim 9, wherein a shape of the magnetic filler has a spherical shape.

13. The electronic circuit package as claimed in claim 9, wherein a main component of the magnetic filler is at least one magnetic material selected from a group consisting of Fe, Fe—Co, Fe—Ni, Fe—Al, and Fe—Si.

14. The electronic circuit package as claimed in claim 1, wherein the magnetic mold resin further includes a non-magnetic filler.

15. The electronic circuit package as claimed in claim 1, wherein the metal film includes at least one metal selected from a group consisting of Au, Ag, Cu, and Al.

16. The electronic circuit package as claimed in claim 15, wherein the surface of the metal film is covered with an antioxidant film.

17. The electronic circuit package as claimed in claim 1, wherein the magnetic film comprises a composite magnetic material in which magnetic fillers are dispersed in a thermosetting resin material.

18. The electronic circuit package as claimed in claim 1, wherein the magnetic film comprises a thin film, a foil or a bulk sheet formed of a soft magnetic material or a ferrite.

* * * * *